(12) United States Patent
Mashita et al.

(10) Patent No.: US 7,682,757 B2
(45) Date of Patent: Mar. 23, 2010

(54) PATTERN LAYOUT FOR FORMING INTEGRATED CIRCUIT

(75) Inventors: Hiromitsu Mashita, Sagamihara (JP); Tadahito Fujisawa, Yokkaichi (JP); Minoru Inomoto, Suzuka (JP); Koji Hashimoto, Yokohama (JP); Yasunobu Kai, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 634 days.

(21) Appl. No.: 11/401,837

(22) Filed: Apr. 12, 2006

(65) Prior Publication Data

US 2006/0228636 A1 Oct. 12, 2006

(30) Foreign Application Priority Data

Apr. 12, 2005 (JP) .............................. 2005-114752

(51) Int. Cl.
G03F 1/00 (2006.01)
(52) U.S. Cl. ............................................ 430/5; 716/19
(58) Field of Classification Search .................... 430/5, 430/30, 311, 394; 438/128; 716/19
See application file for complete search history.

(56) References Cited

U.S. PATENT DOCUMENTS

| 5,242,770 A | 9/1993 | Chen et al. |
| 5,447,810 A | 9/1995 | Chen et al. |
| 5,821,014 A | 10/1998 | Chen et al. |
| 6,818,480 B2 * | 11/2004 | Lee et al. ................... 438/128 |
| 6,846,595 B2 * | 1/2005 | Smith ............................ 430/5 |
| 7,011,936 B2 * | 3/2006 | Nolscher et al. ............. 430/394 |
| 2003/0059685 A1 * | 3/2003 | Ohsaka ............................ 430/5 |
| 2004/0166418 A1 | 8/2004 | Samuels |
| 2004/0172610 A1 | 9/2004 | Liebmann et al. |
| 2005/0026047 A1 * | 2/2005 | Yang ............................. 430/5 |
| 2005/0030502 A1 * | 2/2005 | Fujisawa et al. .............. 355/53 |
| 2005/0125764 A1 | 6/2005 | Semmler |
| 2006/0093926 A1 * | 5/2006 | Fujisawa et al. .............. 430/5 |
| 2008/0137421 A1 * | 6/2008 | Kai et al. ................ 365/185.17 |

FOREIGN PATENT DOCUMENTS

JP 3-210560 9/1991

OTHER PUBLICATIONS

Tadahito Fujisawa et al., Mask Pattern Data Generating Method, Photo Mask Manufacturing Method, and Semiconductor Device Manufacturing Method, U.S. Appl. No. 11/259,069, filed Oct. 27, 2005.

* cited by examiner

*Primary Examiner*—Mark F Huff
*Assistant Examiner*—Stewart A Fraser
(74) *Attorney, Agent, or Firm*—Finnegan, Henderson, Farabow, Garrett & Dunner, L.L.P.

(57) ABSTRACT

A pattern layout for forming an integrated circuit includes a first device pattern, a second device pattern, and an auxiliary pattern. The first device pattern includes a line and a space alternately arrayed on a fixed pitch having regular intervals in a first direction. The second device pattern is disposed on the fixed pitch and separated from the first device pattern in the first direction. The second device pattern has a pattern width an odd-number times larger than the regular intervals of the fixed pitch, wherein the odd-number is set to be three or more. The auxiliary pattern is disposed on the fixed pitch and within the second device pattern and configured not to be resolved by light exposure.

20 Claims, 10 Drawing Sheets

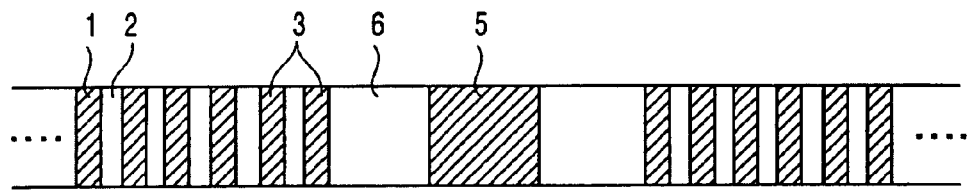
F I G. 5
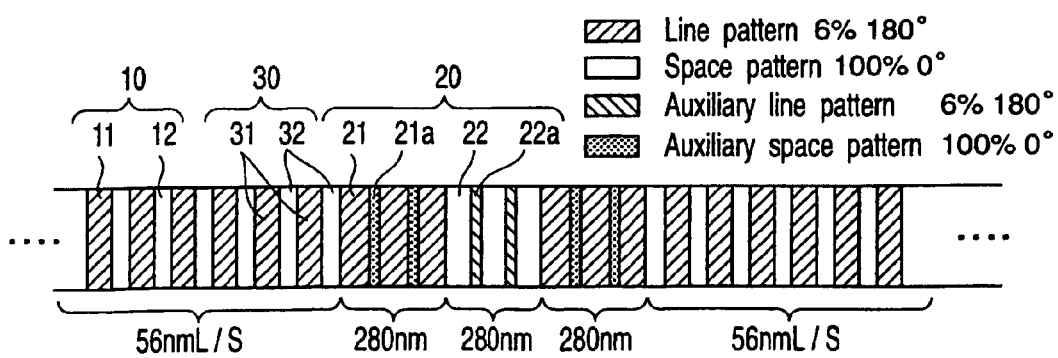
F I G. 6

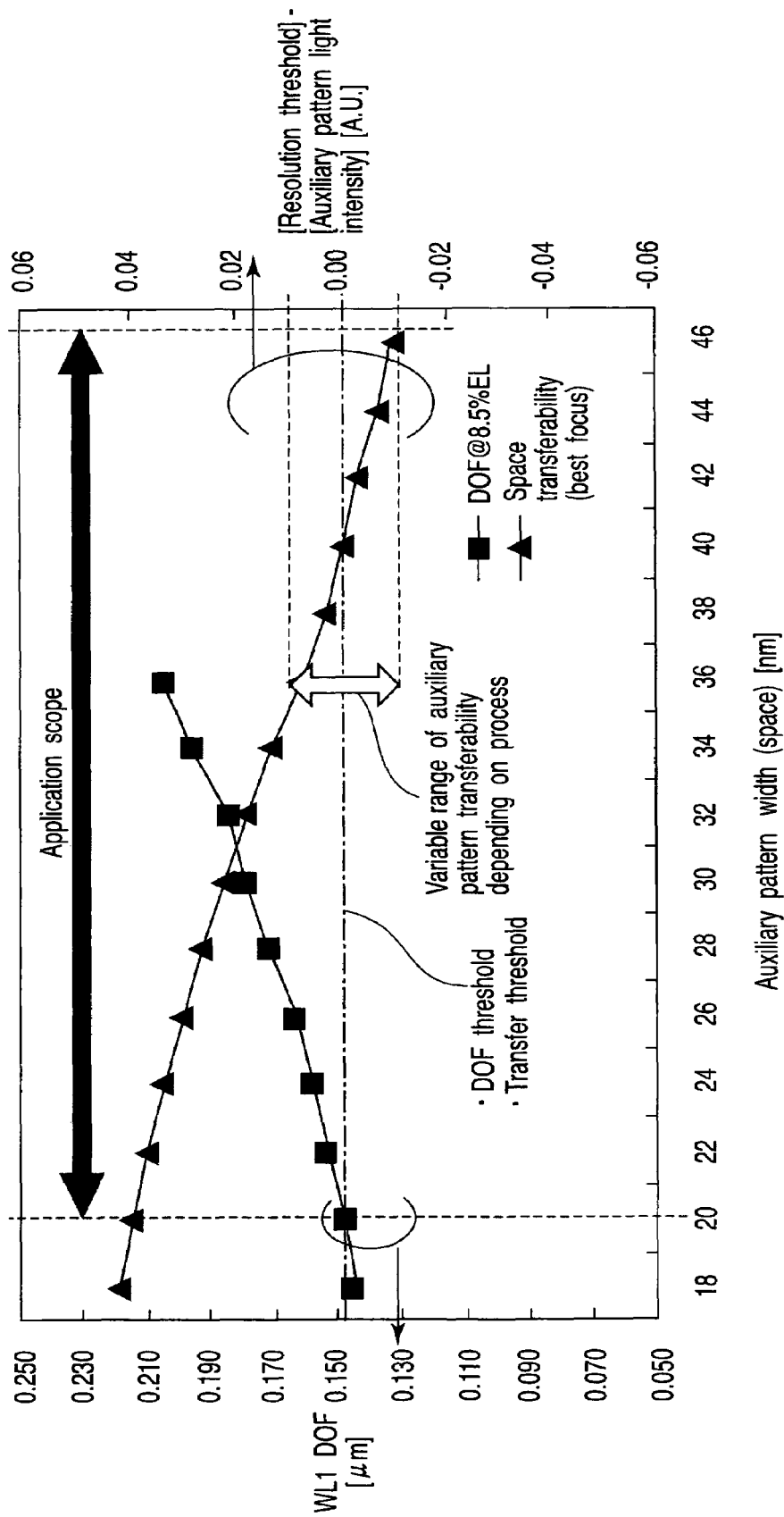
F I G. 18

PATTERN LAYOUT FOR FORMING INTEGRATED CIRCUIT

CROSS-REFERENCE TO RELATED APPLICATIONS

This application is based upon and claims the benefit of priority from prior Japanese Patent Application No. 2005-114752, filed Apr. 12, 2005, the entire contents of which are incorporated herein by reference.

BACKGROUND OF THE INVENTION

1. Field of the Invention

The present invention relates to a pattern layout for forming an integrated circuit, a photo-mask having a mask pattern formed in accordance with the layout, a method of manufacturing a semiconductor device by use of the photo-mask, and a data creation method for creating, from design data, pattern data to be implemented on a photo-mask.

2. Description of the Related Art

In semiconductor integrated circuits, memory cell sections employ repetitive patterns of lines and spaces drawn in accordance with a design rule of a size close to the resolution limit. Where a photo-mask having such patterns is used, it is difficult to attain sufficient resolution by an ordinary lighting condition. Accordingly, in order to obtain effective resolution of narrow pitch patterns, it is necessary to use a lighting source to radiate light through outer and inner portions on a plane associated with the mask pattern surface essentially by Fourier transformation. However, according to this method, the repetitive portion at the center of a memory cell array is provided with a high resolution level, while the boundary at the pattern end portion of the cell array is provided only with a low resolution level.

In order to solve this problem and thereby to improve the light exposure margin at the pattern end portion of the cell array, it is common to used a design in which the pattern pitch is gradually increased in a region where the periodicity is not held. FIG. 1 is a view showing a conventional pattern layout. FIG. 2 is a view showing normalized light intensity for the layout shown in FIG. 1. The image intensity distribution shown in FIG. 2 was obtained by employing a lighting system that was arranged on the basis of dipole illumination with an exposure light wavelength of 193 nm and a maximum coherent factor σ=0.97 and modified to set part of the outermost portion and inner portion of σ to be luminous.

It is assumed that the lighting source and the method of gradually increasing the pitch described above are applied to the mask pattern shown in FIG. 1 (numerals denote dimensions a wafer). In this case, as shown in FIG. 2, the image intensity distribution thus obtained renders a decrease in optical contrast, which results in a decrease in lithography margin, at the line-and-space end portion (a range A in FIG. 2). Further, as compared to a range C in FIG. 2, ranges A and B have larger fluctuations in image intensity distribution, and thus increase the CAD (computer aided design) processing time to perform optical proximity effect correction.

FIG. 3 is a view showing another conventional pattern layout. FIG. 4 is a view showing normalized light intensity for the layout shown in FIG. 3. The same conditions as those used in FIG. 2 were applied to FIG. 4. There is a conventional technique in which a mask layout of the type shown in FIG. 1 is provided with an auxiliary pattern that cannot be resolved (i.e., that is unresolvable), as shown in FIG. 3 (for example, see Jpn. Pat. Appln. KOKAI Publication No. 3-210560 (Patent Document 1)). However, in this case, as shown in FIG. 4, the image intensity distribution thus obtained is not so improved as compared with FIG. 2. Accordingly, this technique cannot avoid a decrease in contrast and a decrease in lithography margin, as in the former case.

As described above, where exposure optical conditions are selected to satisfy the resolution of conventional cell array patterns, the resolution of patterns becomes lower at the end portion of the line-and-space pattern. This brings about a decrease in lithography margin and an increase in CAD processing time to perform optical proximity effect correction.

Accordingly, it is preferable to provide a pattern layout for forming an integrated circuit, which can improve the solution not only of simple repetitive line-and-space patterns but also of the line-and-space pattern end portion. Further, it is preferable to provide a photo-mask having a mask pattern formed in accordance with the layout, a method of manufacturing a semiconductor device by use of the photo-mask, and a data creation method for creating, from design data, pattern data to be implemented on a photo-mask.

BRIEF SUMMARY OF THE INVENTION

According to a first aspect of the present invention, there is provided a pattern layout for forming an integrated circuit, the pattern layout comprising:

a first device pattern including a line and a space alternately arrayed on a fixed pitch having regular intervals in a first direction;

a second device pattern disposed on the fixed pitch and separated from the first device pattern in the first direction, the second device pattern having a pattern width an odd-number times larger than the regular intervals of the fixed pitch, the odd-number being set to be three or more; and an auxiliary pattern disposed on the fixed pitch and within the second device pattern and configured not to be resolved by light exposure.

According to a second aspect of the present invention, there is provided a photo-mask used for a light exposure process to form an integrated circuit, the photo-mask comprising:

a first device pattern including a line and a space alternately arrayed on a fixed pitch having regular intervals in a first direction;

a second device pattern disposed on the fixed pitch and separated from the first device pattern in the first direction, the second device pattern having a pattern width an odd-number times larger than the regular intervals of the fixed pitch, the odd-number being set to be three or more; and an auxiliary pattern disposed on the fixed pitch and within the second device pattern and configured not to be resolved by light exposure.

According to a third aspect of the present invention, there is provided a method of manufacturing a semiconductor device, the method comprising:

exposing a photo-resist film on a semiconductor substrate to light by use of the photo-mask according to the second aspect, so as to transfer the first and second device patterns onto the photo-resist film.

According to a fourth aspect of the present invention, there is provided a data creation method for a photo-mask, the method comprising:

preparing design data that comprises a first device pattern including a line and a space alternately arrayed on a fixed pitch having regular intervals in a first direction, and a second device pattern disposed on the fixed pitch and separated from the first device pattern in the first direction, the second device pattern having a pattern width an odd-number times larger than the regular intervals of the fixed pitch, the odd-number being set to be three or more; and merging an auxiliary pattern into the design data to create pattern data to be implemented on a photo-mask, the auxiliary pattern being disposed on the fixed pitch and within the second device pattern and configured not to be resolved by light exposure.

BRIEF DESCRIPTION OF THE SEVERAL VIEWS OF THE DRAWING

FIG. 5 is a view showing a pattern layout formed on a target substrate, for explaining a first embodiment of the present invention;

FIG. 6 is a view showing a pattern layout formed on a photo-mask, according to the first embodiment;

FIG. 18 is a view showing the dependency of the WL1 DOF of the mask pattern shown in FIG. 14B and the resolution of the auxiliary pattern, on the auxiliary pattern size.

DETAILED DESCRIPTION OF THE INVENTION

Figure 1:
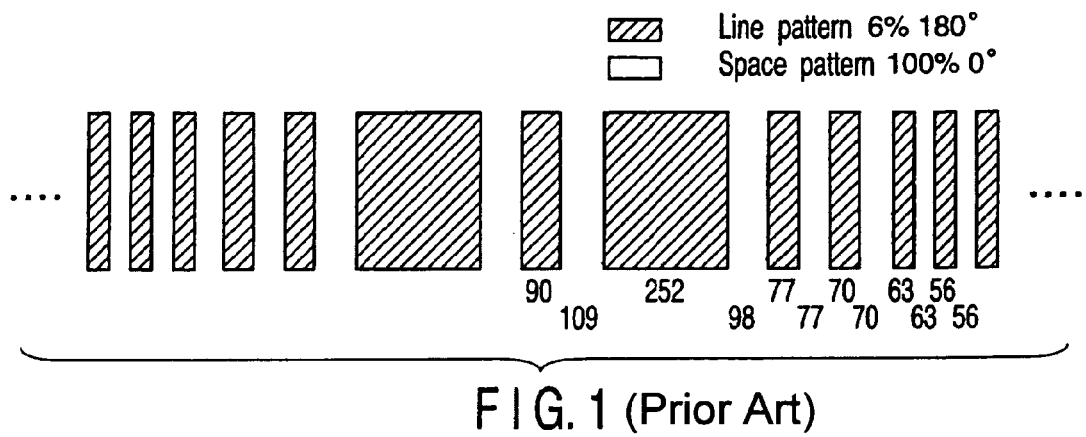
FIG. 1 is a view showing a conventional pattern layout.

Embodiments of the present invention will now be described with reference to the accompanying drawings. In the following description, the constituent elements having substantially the same function and arrangement are denoted by the same reference numerals, and a repetitive description will be made only when necessary.

First Embodiment

This embodiment relates to a technique for setting a dummy pattern and an auxiliary pattern in a line-and-space pattern to be formed on a phase shift mask. The following explanation is exemplified by a process of forming a metal interconnection structure in a NAND flash memory under a 56 nm-design rule using an embedding technique.

FIG. 5 is a plan view showing a 56 nm line-and-space pattern formed on a target substrate. As shown in FIG. 5, a pattern array comprising metal interconnections 1 and inter-metal-interconnection spaces 2 is disposed on a fixed pitch having regular intervals in one direction. At the end portion of the array, two dummy interconnections 3 are disposed on the fixed pitch. Further, outside the dummy interconnections 3, a metal interconnection 5 and an inter-metal-interconnection space 6 are disposed to have a width of 280 nm, which is five times the fixed pitch.

FIG. 6 is a plan view showing a pattern on a photo-mask arranged to form the pattern shown in FIG. 5, wherein the pattern comprises lines and spaces corresponding to the layout. As shown in FIG. 6, a first device pattern 10 comprising a line 11 and a space 12 is disposed on a fixed pitch. Further, a dummy pattern 30 comprising a line 31 and a space 32 is disposed on the fixed pitch. Furthermore, a second device pattern 20 comprising a line 21 for 280 nm and a space 22 for 280 nm is disposed on the fixed pitch. In other words, the first device pattern 10 has a pattern width equal to the intervals of the fixed pitch. The second device pattern 20 has a pattern width five times as large as the intervals of the fixed pitch.

In this case, since the metal interconnection is formed by an embedding technique, the line 11 on the photo-mask corresponds to the inter-metal-interconnection space 2, and the space 12 corresponds to the metal interconnection 1. Similarly, the space 32 corresponds to the dummy interconnection 3, the line 21 corresponds to the inter-metal-interconnection space 6 of 280 nm, and the space 22 corresponds to the metal interconnection 5 of 280 nm.

In the second device pattern 20, the line 21 is provided with an auxiliary space pattern 21a formed on the fixed pitch. The space 22 is provided with an auxiliary line pattern 22a formed on the fixed pitch. The line width and space width of the auxiliary patterns 21a and 22a are set at 32 nm. The lines 11, 21, and 31, and auxiliary line pattern 22a are areas with a transmittancy of 6% and a phase of 180°. The spaces 12, 22, and 32, and auxiliary space pattern 21a are areas with a transmittancy of 100% and a phase of 0°. In this embodiment, the end portion of the line-and-space pattern array is arranged to have three sets of the line portion and space portion each for a pattern width of 280 nm.

Figure 7:
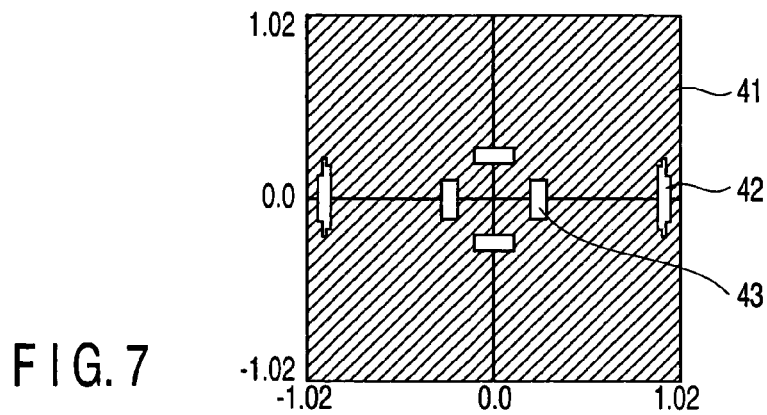
FIG. 7 is a view showing a lighting source arrangement used for the first embodiment.

FIG. 7 is a view showing a lighting source arrangement used for the first embodiment. In this case, the exposure optical conditions comprise an exposure light wavelength of 193 nm and a maximum coherent factor σ=0.97. As shown in FIG. 7, this specific illumination is arranged to radiate light through outer and inner portions on a plane associated with the mask pattern surface essentially by Fourier transformation. FIG. 7 shows a predetermined face 41 which includes an outer light source surface 42 configured to provide illumination light for resolving a line/space of 56 nm. The face 41 also includes an inner light source surface 43 configured to provide illumination light for resolving a line/space of 280 nm. The light amount is set to have such distribution on the predetermined face 41 shown in FIG. 7 that is lower at the inner portion than the outer portion. The light amount ratio between the outer light source surface 42 and inner light source surface 43 is set at 1:0.3. The intensity ratio is not limited to this value, and it may be set at an optimum value in accordance with process conditions.

Figure 8:
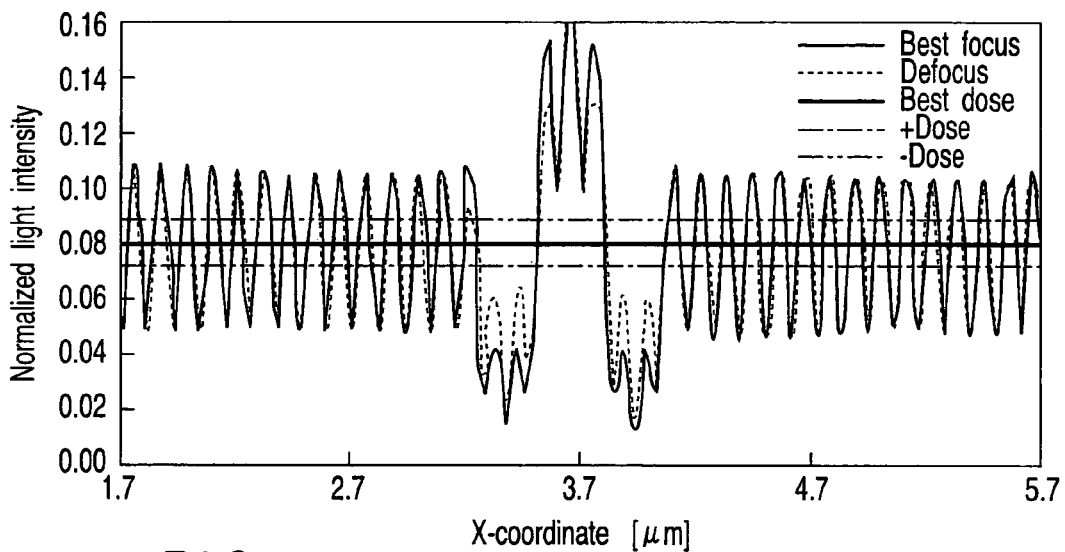
FIG. 8 is a view showing an example of normalized light intensity calculated by simulation for the layout shown in FIG. 6.
Figure 9:
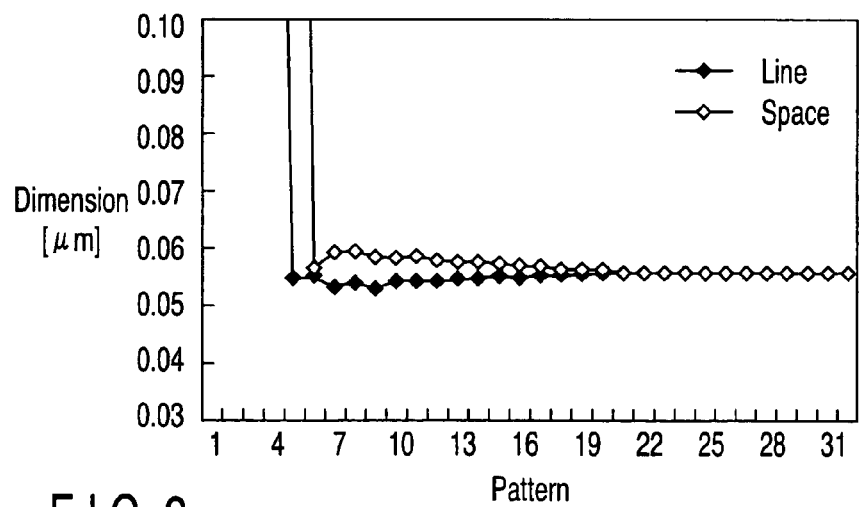
FIG. 9 is a view showing an example of dimensions calculated by simulation for the layout shown in FIG. 6.

FIG. 8 is a view showing an example of normalized light intensity calculated by simulation for the layout shown in FIG. 6. FIG. 9 is a view showing an example of dimensions calculated by simulation for the layout shown in FIG. 6. Further, Table 1 shows DOFs calculated by simulation for a present example PE1 with an auxiliary pattern of 32 nm and for a comparative example CE1 according to a conventional technique shown in FIG. 2. The DOFs are expressed by values obtained under conditions comprising a line width fluctuation tolerance of ±10% and a dose amount tolerance of 8.5%.

TABLE 1

| Example | Pattern | Depth of focus [µm] | |
|---|---|---|---|
| | | Line | Space |
| PE1 | First (dummy) | 0.182 | 0.130 |
| | Second (dummy) | 0.300 | 0.300 |
| | Third (dummy) | 0.300 | 0.300 |
| CE1 | First (dummy) | <0.100 | <0.100 |

Figure 2:
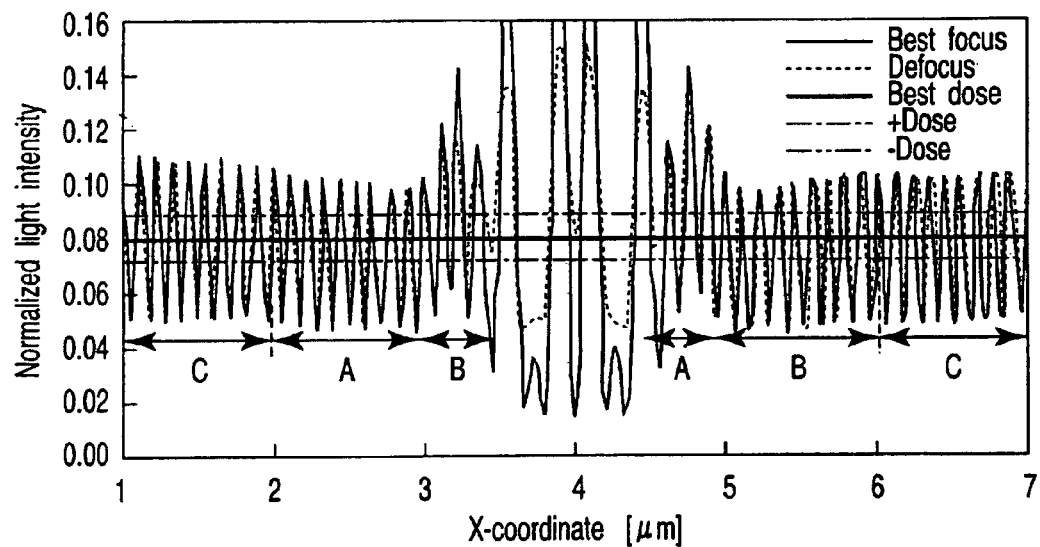
FIG. 2 is a view showing normalized light intensity for the layout shown in FIG. 1.
Figure 3:
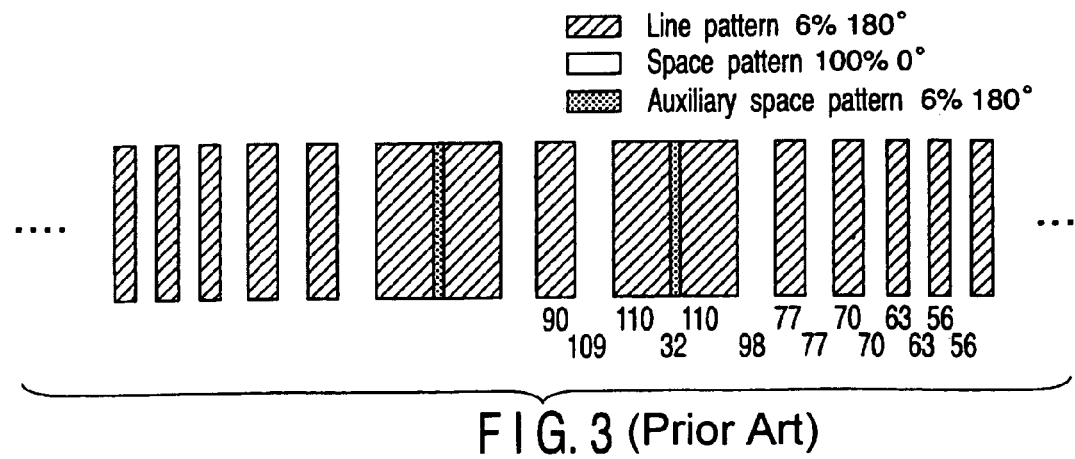
FIG. 3 is a view showing another conventional pattern layout.
Figure 4:
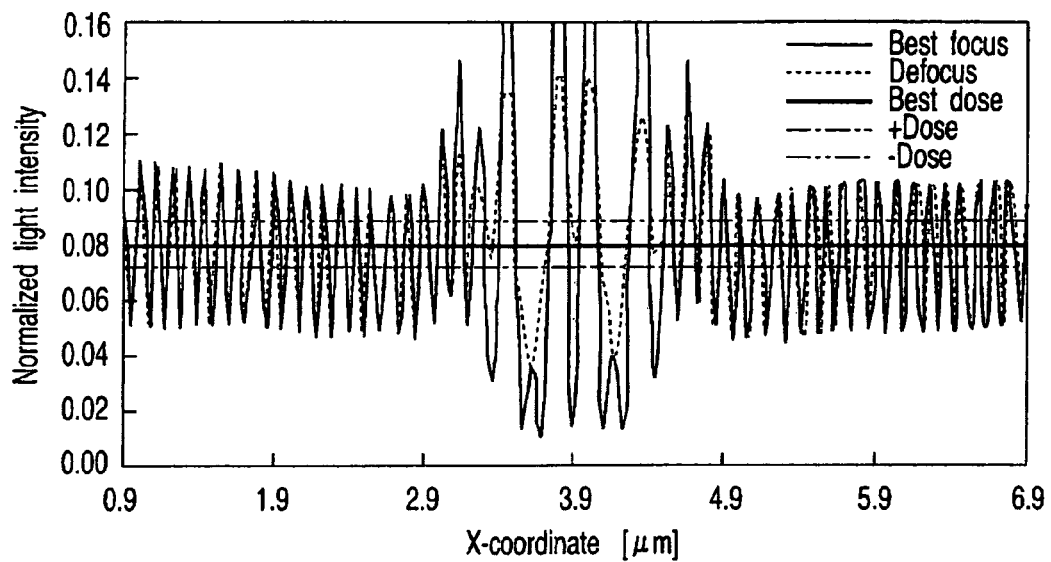
FIG. 4 is a view showing normalized light intensity for the layout shown in FIG. 3.

As shown in FIGS. 8 and 9, this embodiment can prevent a decrease in contrast from occurring near the end of periodicity and alleviate the influence of an optical proximity effect, as compared to the results shown in FIGS. 2 and 4 obtained by conventional techniques. Consequently, it is possible to ensure a sufficient DOF necessary for production. This is achieved by the auxiliary patterns 21a and 22a being disposed in light of the basic periodicity (half pitch: 56 nm). Further, this embodiment employs a dummy pattern (two dummy patterns in this example). In this case, while considering a decrease in the lithography margin of the dummy pattern (the first pattern in this example), the lithography margin of a device pattern (from the third pattern in this example) can be sufficiently secured.

Figure 10:
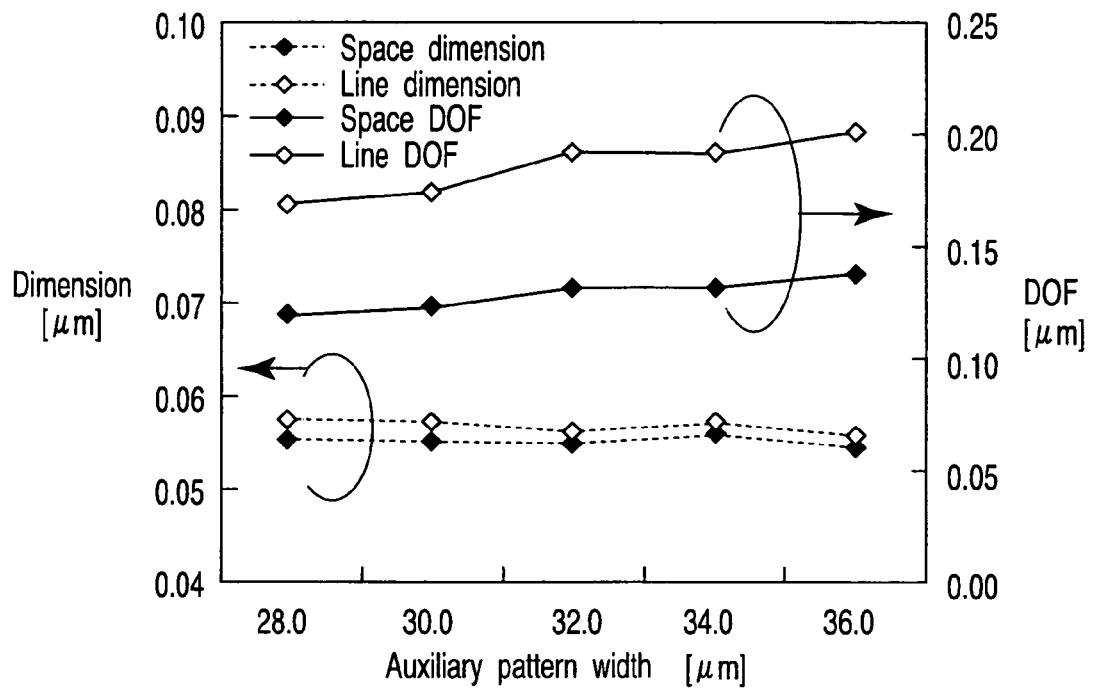
FIG. 10 is a view showing the relationship of the auxiliary pattern width with the dummy pattern dimension and DOF (Depth of Focus)

This embodiment uses an auxiliary pattern of 32 nm. Where the auxiliary pattern width is changed, the DOF of the array end portion is also changed. FIG. 10 is a view showing the relationship of the auxiliary pattern width with the dummy pattern dimension and DOF (Depth of Focus). As shown in FIG. 10, as the auxiliary pattern width is increased, the dummy pattern dimension is constant while the DOF is increased. However, in order to prevent an auxiliary pattern from being resolved, it is preferable to select the maximum auxiliary pattern width within a range where the auxiliary pattern is not resolved. A discussion on preferable auxiliary pattern dimensions will be given in the second embodiment.

Figure 11:
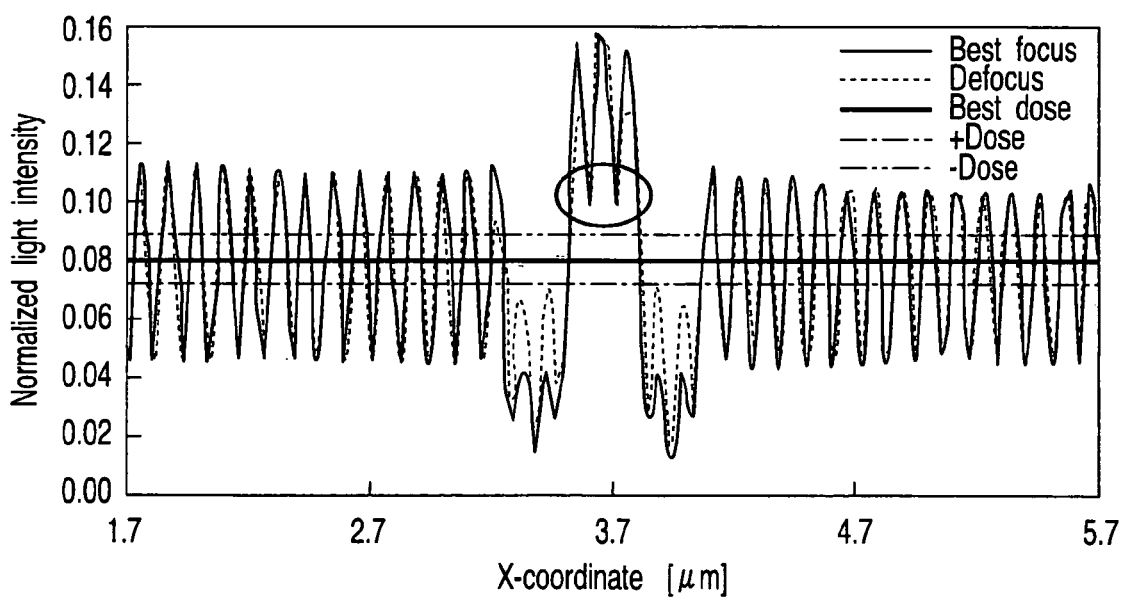
FIG. 11 is a view showing an example of normalized light intensity calculated by simulation for the layout shown in FIG. 6, where the light amount ratio in illumination light between outer and inner portions is set at 1:0.2.
Figure 12:
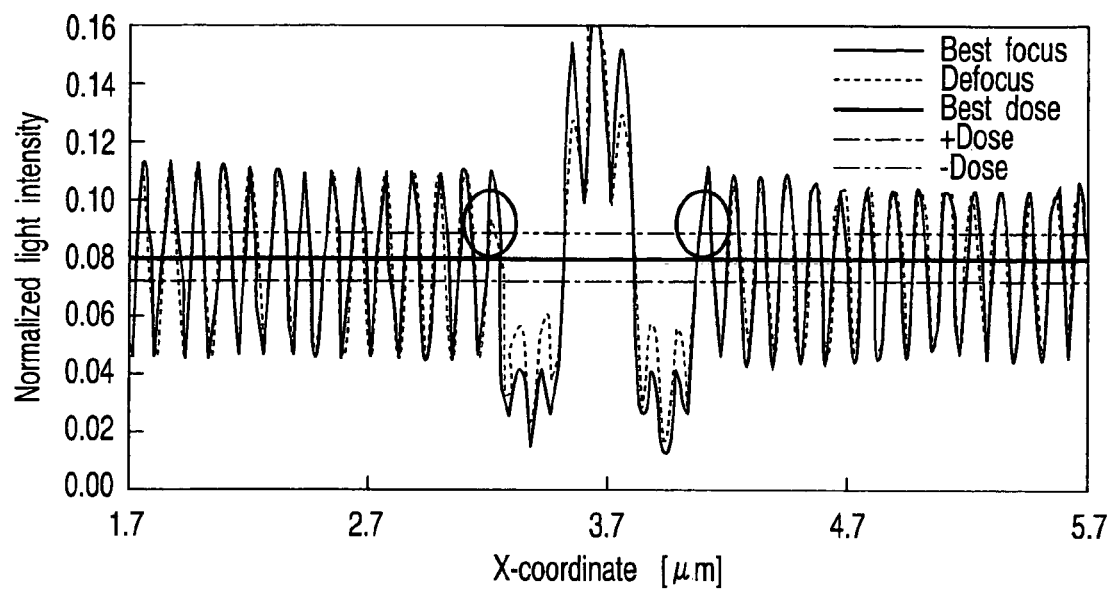
FIG. 12 is a view showing an example of normalized light intensity calculated by simulation for the layout shown in FIG. 6, where the light amount ratio in illumination light between outer and inner portions is set at 1:0.4.

Further, where the light amount ratio between the outer light source surface 42 and inner light source surface 43 of the predetermined face 41 shown in FIG. 7 is changed, the transfer performance of an auxiliary pattern can be controlled, as shown in FIGS. 11 and 12.

FIG. 11 is a view showing normalized light intensity, where the light amount ratio in illumination light between the outer and inner light source surfaces 42 and 43 is set at 1:0.2. FIG. 12 is a view showing normalized light intensity, where the light amount ratio in illumination light between the outer and inner light source surfaces 42 and 43 is set at 1:0.4. As shown in FIG. 11, where the light amount ratio between the outer and inner light source surfaces 42 and 43 is set at 1:0.2, there is a risk that an auxiliary pattern of the line type is resolved at the portion indicated by a symbol "○" where a fluctuation occurs toward the under-dose side. On the other hand, as shown in FIG. 12, where the light amount ratio between the outer and inner light source surfaces 42 and 43 is set at 1:0.4, there is a risk that a photo-resist pattern is shortened at the portion indicated by a symbol "○" where a fluctuation occurs toward the under-dose side or where defocusing is added. As described above, the light amount ratio between the outer and inner light source surfaces 42 and 43 is preferably set to be within a range of from 0.2 to 0.4.

In this embodiment, auxiliary patterns of both the line type and space type are used, but only one of the types may be used. The dummy pattern does not necessarily have the same width as that of the first device pattern 10 of the line-and-space type. It suffices, if the dummy pattern is arranged such that resolved line or space portions have a width within a range of from P×(2×N−1)×0.8 to P×(2×N−1)×1.2, where P denotes the fixed pitch and N denotes a natural number.

As described above, according to this embodiment, the dummy pattern 30 and auxiliary patterns 21a and 22a are added to the device patterns 10 and 20. With this arrangement, the resolution performance of a line-and-space pattern near the end of periodicity is improved, so that dimension fluctuations due to defocusing are decreased and the lithography margin is improved. Further, because the periodicity is maintained, the influence of aberration is alleviated, and the optical proximity effect is also alleviated. Consequently, it is possible to decrease the CAD processing time to perform optical proximity effect correction.

Second Embodiment

This embodiment relates to a technique for setting a dummy pattern and an auxiliary pattern in a gate interconnection pattern to be formed on a phase shift mask. The following explanation is exemplified by a process of forming a gate interconnection structure in a NAND flash memory.

Figure 13:
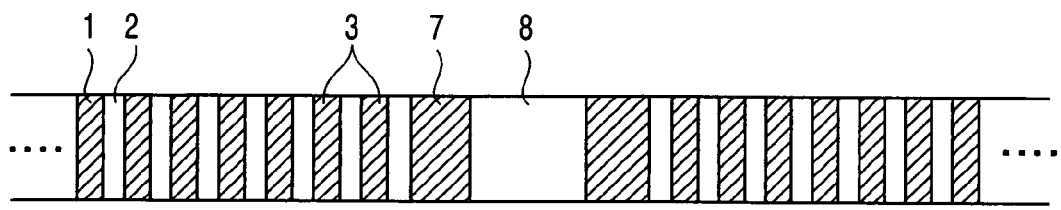
FIG. 13 is a view showing a pattern layout formed on a target substrate, for explaining a second embodiment of the present invention.
Figure 14A:
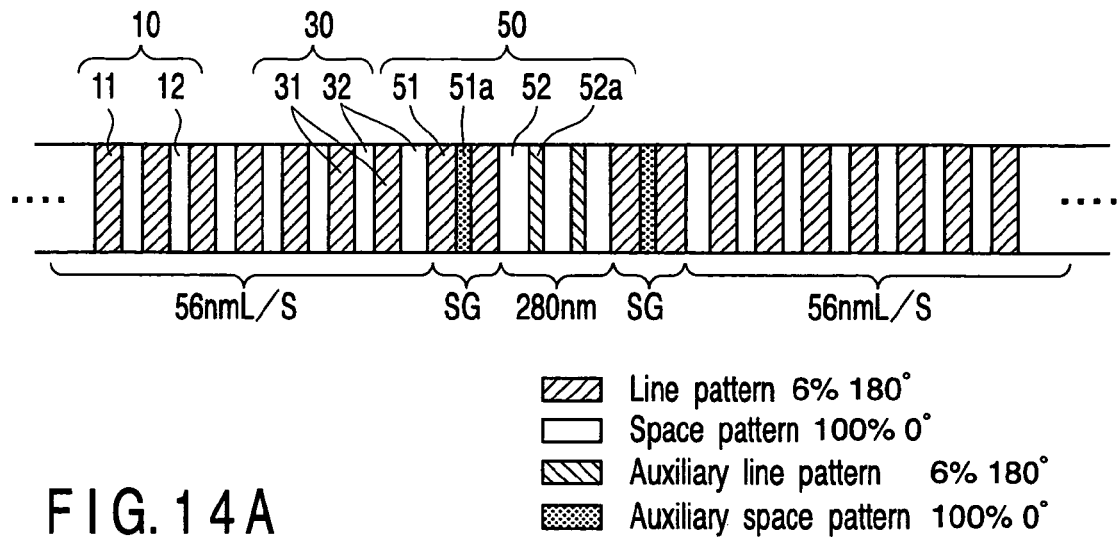
FIGS. 14A and 14B are views each showing a pattern layout formed on a photo-mask, according to the second embodiment.
Figure 14B:
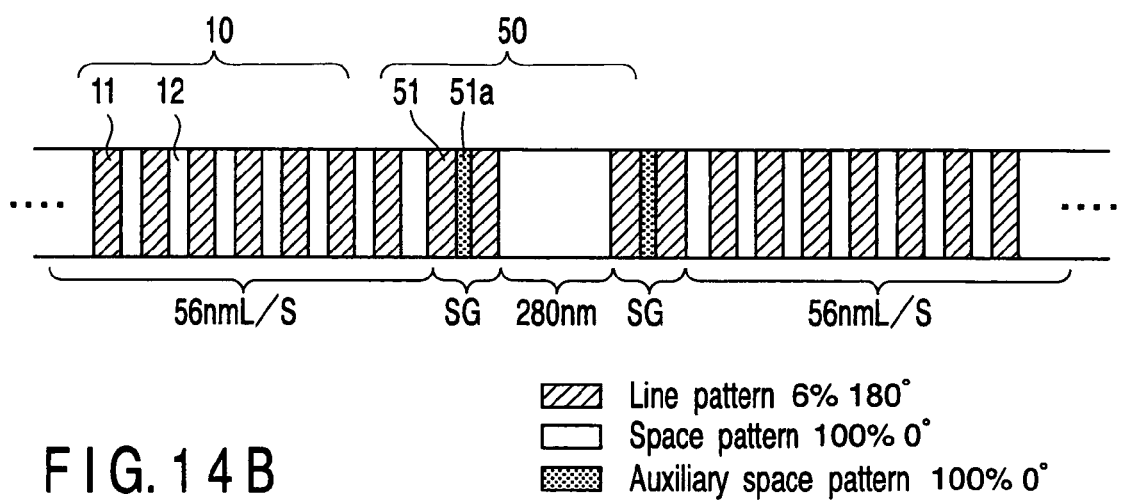

FIG. 13 is a view showing a pattern layout formed on a target substrate, for explaining a second embodiment of the present invention. FIGS. 14A and 14B are views each showing a pattern layout formed on a photo-mask corresponding to the pattern shown in FIG. 13, according to the second embodiment.

As shown in FIG. 13, a pattern array comprising gate interconnections 1 and inter-gate-interconnection spaces 2 is formed on a fixed pitch (56 nm), as a pattern on a target substrate. Further, the end thereof is provided with a select gate (SG) interconnection 7 having a width of 168 nm, which is three times the fixed pitch, and an inter-SG-line space 8 having a width of 280 nm, which is five times the fixed pitch.

As a pattern on a photo-mask, as shown in FIGS. 14A and 14B, a first device pattern 10 comprising a line 11 and a space 12 is disposed on a fixed pitch. Further, a second device pattern 50 comprising a line 51 for 168 nm and a space 52 for 280 nm is disposed on the fixed pitch.

The line 11 on the photo-mask corresponds to the gate interconnection 1, and the space 12 corresponds to the inter-gate-interconnection space 2. Similarly, the line 51 corresponds to the SG interconnection 7, and the space 52 corresponds to the inter-SG-line space 8.

In the pattern shown in FIG. 14A, the line 51 of the second device pattern 50 is provided with an auxiliary space pattern 51a formed on the fixed pitch. The space 52 is provided with an auxiliary line pattern 52a formed on the fixed pitch. The line width and space width of the auxiliary patterns 51a and 52a are set at 32 nm. The lines 11 and 51, and auxiliary line pattern 52a are areas with a transmittancy of 6% and a phase of 180°. The spaces 12 and 52, and auxiliary space pattern 51a are areas with a transmittancy of 100% and a phase of 0°.

FIG. 14B shows a modification of FIG. 14A, where the space 52 includes no auxiliary line pattern 52a formed on the fixed pitch. Both the patterns shown in FIGS. 14A and 14B can provide the same effect, by making fine adjustment in design, such as adjustment in width of the SG and the space between the SG and gate line.

Figure 15:
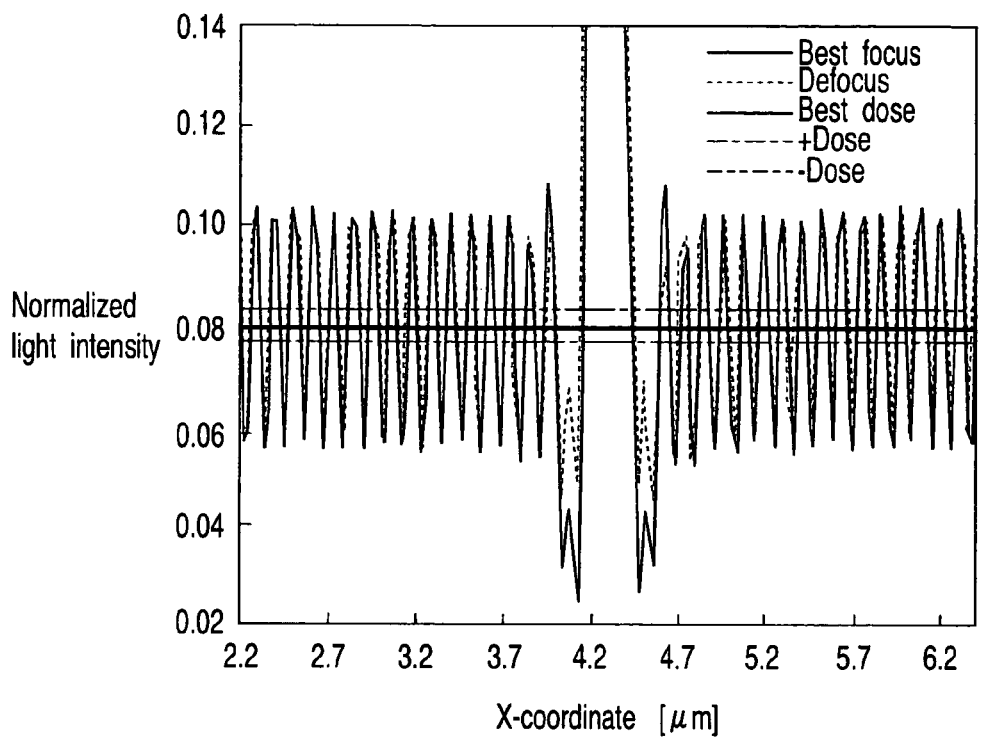
FIG. 15 is a view showing an example of normalized light intensity calculated by simulation for the layout shown in FIG. 14B.
Figure 16:
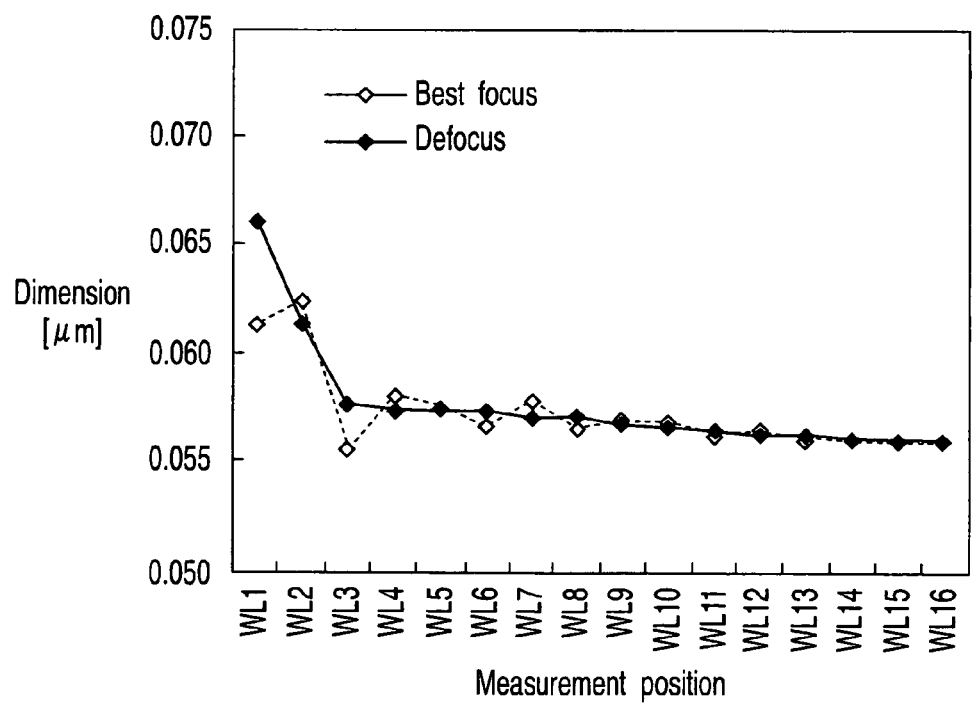
FIG. 16 is a view showing an example of dimensions calculated by simulation for the layout shown in FIG. 14B.

FIG. 15 is a view showing an example of normalized light intensity calculated by simulation for the layout shown in FIG. 14B. FIG. 16 is a view showing an example of dimensions calculated by simulation for the layout shown in FIG. 14B. Further, Table 2 shows DOFs calculated by simulation for a present example PE2 with the photo-mask pattern shown in FIG. 14B and for a comparative example CE2 according to a conventional technique. The exposure optical conditions are set to be the same as those of the first embodiment. The DOFs are expressed by values obtained under conditions comprising a line width fluctuation tolerance of ±10% and a dose amount tolerance of 8.5%. In the comparative example CE2, a photo-mask pattern is arranged such that the pattern of the end of periodicity (the SG pattern periphery in this example) is formed by gradually increasing the pitch from the line-and-space pattern of 56 nm. The DOFs in Table 2 are expressed by values obtained by this photo-mask pattern while optimizing the mask bias to set a suitable light exposure margin.

TABLE 2

| Pattern | DOF | |
|---|---|---|
| | PE2 | CE2 |
| SG | 0.180 | 0.180 |
| WL1 | 0.180 | 0.140 |
| WL2 | 0.180 | 0.180 |
| WL3 | 0.180 | 0.180 |
| WL16 | 0.180 | 0.180 |

As shown in FIGS. 15 and 16, this embodiment can prevent a decrease in contrast from occurring near the end of periodicity (the pattern around the SG, and particularly WL1), and alleviate the influence of an optical proximity effect. Consequently, it is possible to ensure a sufficient DOF necessary for production. This is achieved by the auxiliary patterns disposed in light of the basic periodicity (half pitch: 56 nm).

Next, an explanation will be given of the auxiliary pattern size effective in improving the light exposure margin according to this embodiment.

This examination is made where the mask pattern shown in FIG. 14B is used. As the auxiliary pattern size is increased, the light exposure margin is improved. However, the auxiliary pattern may be resolved if the size is too large. Accordingly, it is necessary to select the maximum size within a range where the auxiliary pattern is not resolved.

Figure 17:
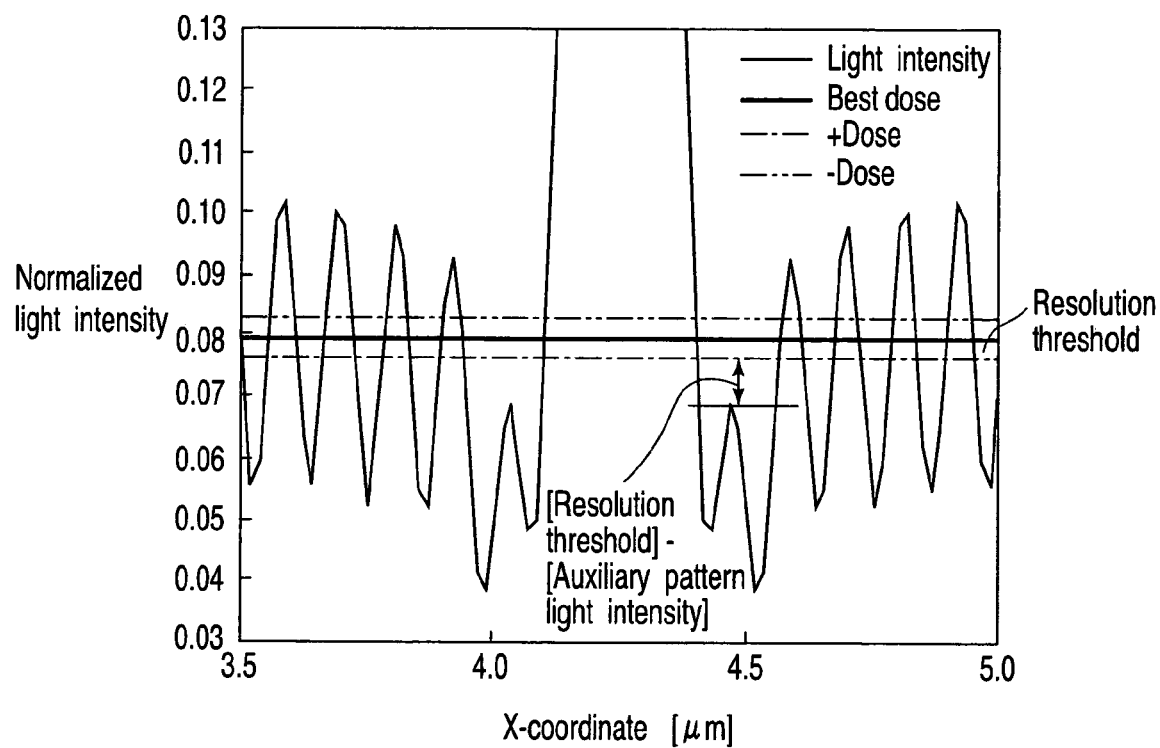
FIG. 17 is a view showing the image intensity distribution of the auxiliary pattern area of the mask pattern shown in FIG. 14B.

FIG. 17 is a view showing the image intensity distribution of the auxiliary pattern area of the mask pattern shown in FIG. 14B. Along with an increase in auxiliary pattern size, the difference between the resolution threshold and auxiliary pattern intensity is smaller at a portion indicated by an arrow in FIG. 17. When the difference takes on zero, an auxiliary pattern starts being transferred onto a photo-resist.

FIG. 18 is a view showing the dependency of the WL1 DOF and the resolution of the auxiliary pattern, on the auxiliary pattern size. Since the NAND flash memory under a 56 nm-design rule requires a DOF of 0.15 μm, the auxiliary pattern size has to be set at 20 nm or more. On the other hand, as regards the resolution performance of an auxiliary pattern, if the value of [resolution threshold]−[auxiliary pattern intensity] becomes zero, i.e., if the auxiliary pattern size reaches 40 nm, the auxiliary pattern is transferred onto a photo-resist. However, this threshold fluctuates to some extent, depending on the exposure optical conditions, photo-resist performance, and so forth. Further, in practice, even if an auxiliary pattern is partially transferred, it is acceptable if no problem arises after being processed. Empirically, it is preferable to select an auxiliary pattern line width within a range of from −0.01 to +0.01 in terms of the value of [resolution threshold]−[auxiliary pattern intensity].

Accordingly, under the conditions in this embodiment, the auxiliary space pattern size is preferably set to be within a range of from 20 nm to 46 nm. Where this result is defined by a dimension normalized by λ/NA in light of the exposure optical conditions, the auxiliary space pattern size is preferably expressed by a value within a range of from 0.095 to 0.22. It should be noted that the result described above represents a range of preferable values for the auxiliary space pattern. On the other hand, although the detail thereof is not described here, the same examination was also performed, as regards the auxiliary line pattern. As a result, it has been found that the auxiliary line pattern size to be not transferred to a photo-resist is larger than the auxiliary space pattern size by about 0.01 (a dimension normalized by λ/NA). Accordingly, where the auxiliary line pattern is involved, it is necessary to set the auxiliary pattern size to be 0.23 or less in terms of a dimension normalized by λ/NA.

Third Embodiment

This embodiment relates to a technique for setting a line-and-space pattern and an auxiliary pattern and a technique for performing optical proximity effect correction, in a lead-out interconnection pattern to be formed on a phase shift mask. The following explanation is exemplified by a process of forming a lead-out line portion of a gate interconnection structure in a NAND flash memory under a 56 nm-design rule.

Figure 19:
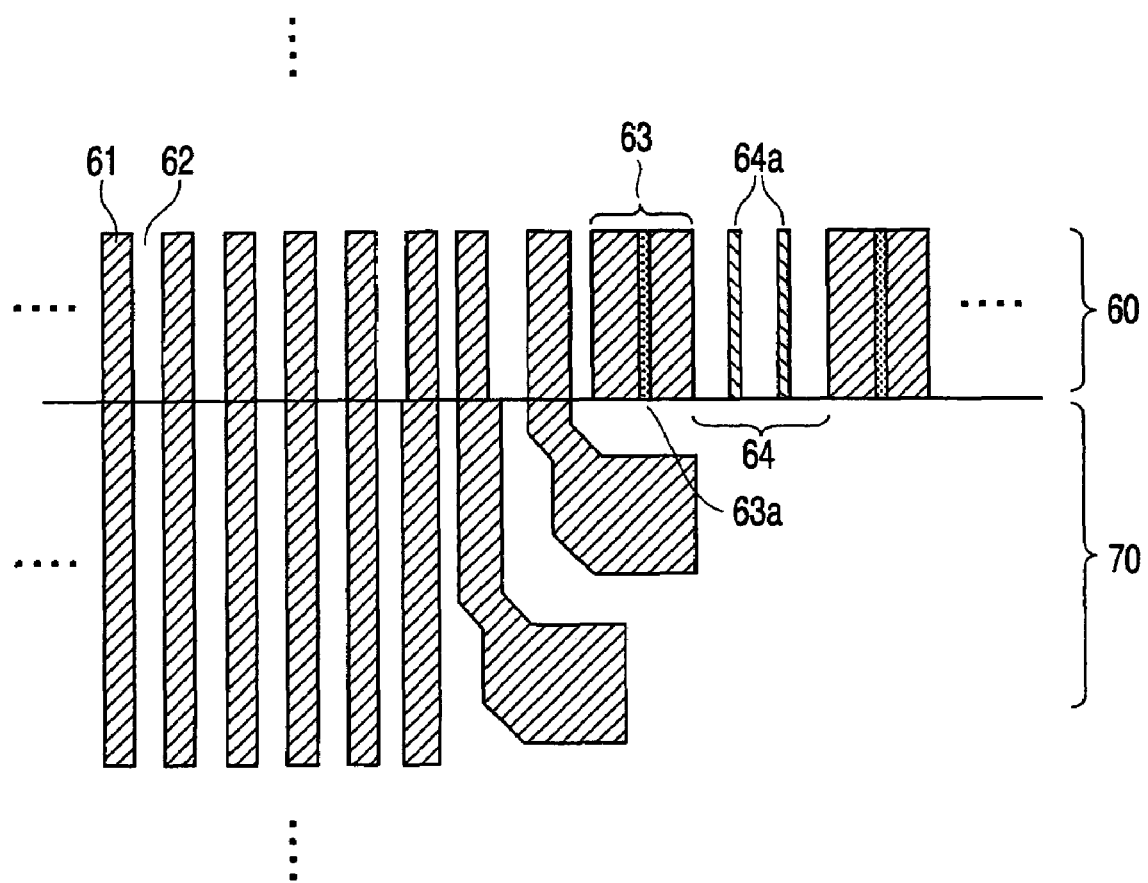
FIG. 19 is a view showing a pattern layout formed on a photo-mask, according to a third embodiment of the present invention.

FIG. 19 is a view showing a pattern layout formed on a photo-mask, according to a third embodiment of the present invention. In a cell area 60, a line-and-space pattern of 56 nm comprising a line 61 and a space 62 is disposed on a fixed pitch. Further, on the fixed pitch, there is a select gate 63 having a width of 168 nm, which is three times the fixed pitch, and an inter-SG space 64 having a width of 280 nm, which is five times the fixed pitch. The select gate 63 is provided, at the center, with an auxiliary space pattern 63a of 32 nm formed on the fixed pitch. The inter-SG space 64 is provided with auxiliary line patterns 64a of 32 nm formed on the fixed pitch.

On the other hand, in a lead-out line area 70, there is a pattern deviated from the fixed pitch and subjected to an optical proximity effect correction along with a pattern around it. At the portion around the boundary between the areas 60 and 70, only the area 70 side is subjected to a CAD process, while using the area 60 as reference data.

Using the layout described above, this embodiment can prevent a decrease in contrast from occurring near the end of periodicity and alleviate the influence of an optical proximity effect, as in the first and second embodiments. Consequently, it is possible to ensure a sufficient DOF necessary for production.

Matters Common to First to Third Embodiments

In the embodiments described above, an explanation is given of a pattern layout used for a semiconductor device, and a photo-mask with a mask pattern formed in accordance with the layout. The present invention is further applied to a method of manufacturing a semiconductor device by use of a photo-mask, and a data creation method for creating, from design data, pattern data to be implemented on a photo-mask.

In the embodiments described above, an explanation is given of a phase shift mask. The transmittancy and phase of lines in a phase shift mask is not limited to those described in the embodiments, and they can be suitably changed, as needed. The pattern layouts described in the embodiments may be applied to an ordinary photo-mask other than a phase shift mask. Further, if the lithography margin at the end portion of a device pattern for an integrated circuit can be sufficiently secured, no dummy pattern needs to be included therein.

According to the embodiments described above, there is a first device pattern comprising a line and a space, and a second device pattern having a larger width and provided with a dummy pattern and an auxiliary pattern. Consequently, it is possible to improve the pattern resolution performance at the end portion of the line-and-space pattern. Further, both the dummy pattern and auxiliary pattern are disposed on fixed pitch and have periodicity. Consequently, it is possible to suppress a decrease in lithography margin and an increase in CAD processing time due to addition of these patterns.

As described above, the present invention can be applied to a pattern layout, photo-mask, semiconductor device manufacturing method, and data creation method. Particularly, the present invention may be implemented in accordance with the following arrangements (a) to (c).

(a) Metal Interconnection:

(a1) A pattern layout for forming an integrated circuit, the pattern layout comprising: a first device pattern including a line and a space alternately arrayed on a fixed pitch having regular intervals in a first direction; a second device pattern disposed on the fixed pitch and separated from the first device pattern in the first direction, the second device pattern having a pattern width an odd-number times larger than the regular intervals of the fixed pitch, the odd-number being set to be three or more; and an auxiliary pattern disposed on the fixed pitch and within the second device pattern and configured not to be resolved by light exposure.

(a2) A photo-mask used for a light exposure process to form an integrated circuit, the photo-mask comprising: a first device pattern including a line and a space alternately arrayed on a fixed pitch having regular intervals in a first direction; a second device pattern disposed on the fixed pitch and separated from the first device pattern in the first direction, the second device pattern having a pattern width an odd-number times larger than the regular intervals of the fixed pitch, the odd-number being set to be three or more; and an auxiliary pattern disposed on the fixed pitch and within the second device pattern and configured not to be resolved by light exposure.

(a3) A method of manufacturing a semiconductor device, the method comprising: exposing a photo-resist film on a semiconductor substrate to light by use of the photo-mask according to (a2), so as to transfer the first and second device patterns onto the photo-resist film.

(a4) A data creation method for a photo-mask, the method comprising: preparing design data that comprises a first device pattern including a line and a space alternately arrayed on a fixed pitch having regular intervals in a first direction, and a second device pattern disposed on the fixed pitch and separated from the first device pattern in the first direction, the second device pattern having a pattern width an odd-number times larger than the regular intervals of the fixed pitch, the odd-number being set to be three or more; and merging an auxiliary pattern into the design data to create pattern data to be implemented on a photo-mask, the auxiliary pattern being disposed on the fixed pitch and within the second device pattern and configured not to be resolved by light exposure.

The following arrangements are preferable manners of the arrangements (a1) to (a4).

(1) The second device pattern comprises a pattern including at least one line and at least one space alternately arrayed, which have a pattern width within a range of from $P \times (2 \times N-1) \times 0.8$ to $P \times (2 \times N-1) \times 1.2$, where P denotes the fixed pitch and N denotes a natural number.

(2) The auxiliary pattern comprises a line or space, which has a pattern width of $0.23 \times \lambda / NA$ or less, where $\lambda$ denotes an exposure light wavelength and NA denotes a numerical aperture of a light exposure apparatus.

(3) The pattern layout further comprises a dummy pattern disposed between the first and second device patterns and configured not to affect operation of the integrated circuit, wherein the dummy pattern includes a line and a space alternately arrayed on the fixed pitch.

(4) Space portions of the first device pattern, the second device pattern, and the auxiliary pattern are set to have the same phase relative to exposure light. Line portions of the first device pattern, the second device pattern, and the auxiliary pattern are set to have the same phase relative to exposure light, which is reverse to that of the space portions.

(5) Illumination for irradiating the photo-mask with light in a diagonal direction is used to expose the photo-resist film to light.

(b) Gate Interconnection:

(b1) A pattern layout for forming gate interconnection of a NAND flash memory at an end portion of a line-and-space pattern array disposed on a fixed pitch, the pattern layout comprising: a device pattern disposed on the fixed pitch to correspond to a select gate and a portion around the select gate; and an auxiliary pattern disposed on the fixed pitch and within the device pattern and configured not to be resolved by light exposure, wherein the auxiliary pattern comprises an auxiliary space pattern disposed within a select gate pattern, and an auxiliary line pattern disposed within an inter-select-gate space pattern.

(b2) A photo-mask used for a light exposure process to form an integrated circuit, and including a pattern layout for forming gate interconnection of a NAND flash memory at an end portion of a line-and-space pattern array disposed on a fixed pitch, the photo-mask comprising: a device pattern disposed on the fixed pitch to correspond to a select gate and a portion around the select gate; and an auxiliary pattern disposed on the fixed pitch and within the device pattern and configured not to be resolved by light exposure, wherein the auxiliary pattern comprises an auxiliary space pattern disposed within a select gate pattern, and an auxiliary line pattern disposed within an inter-select-gate space pattern.

(b3) A method of manufacturing a semiconductor device, the method comprising: exposing a photo-resist film on a semiconductor substrate to light by use of the photo-mask according to (b2), so as to transfer the device pattern onto the photo-resist film.

(b4) A data creation method for a photo-mask including a pattern layout for forming gate interconnection of a NAND flash memory at an end portion of a line-and-space pattern array disposed on a fixed pitch, the method comprising: preparing design data that comprises a device pattern disposed on the fixed pitch to correspond to a select gate and a portion around the select gate; and merging an auxiliary pattern into the design data to create pattern data to be implemented on a photo-mask, the auxiliary pattern being disposed on the fixed pitch and within the device pattern and configured not to be resolved by light exposure, wherein the auxiliary pattern comprises an auxiliary space pattern disposed within a select gate pattern, and an auxiliary line pattern disposed within an inter-select-gate space pattern.

(C) Lead-Out Interconnection:

(c1) A pattern layout for forming a lead-out line portion of a NAND flash memory to connect a line-and-space pattern disposed on a fixed pitch to an upper interconnection, the pattern layout comprising: a device pattern disposed on the fixed pitch; an auxiliary pattern disposed on the fixed pitch and within the device pattern and configured not to be resolved by light exposure; and a lead-out interconnection pattern, which is deviated from the fixed pitch and adjacent to the fixed pitch, wherein the lead-out interconnection pattern comprises a pattern subjected to optical proximity effect correction by a CAD process.

(c2) A photo-mask used for a light exposure process to form an integrated circuit, and including a pattern layout for forming a lead-out line portion of a NAND flash memory to connect a line-and-space pattern disposed on a fixed pitch to an upper interconnection, the photo-mask comprising: a device pattern disposed on the fixed pitch; an auxiliary pattern disposed on the fixed pitch and within the device pattern and configured not to be resolved by light exposure; and a lead-out interconnection pattern, which is deviated from the fixed pitch and adjacent to the fixed pitch, wherein the lead-out interconnection pattern comprises a pattern subjected to optical proximity effect correction by a CAD process.

(c3) A method of manufacturing a semiconductor device, the method comprising: exposing a photo-resist film on a semiconductor substrate to light by use of the photo-mask according to (c2), so as to transfer the device pattern and the lead-out interconnection pattern onto the photo-resist film.

(c4) A data creation method for a photo-mask including a pattern layout for forming a lead-out line portion of a NAND flash memory to connect a line-and-space pattern disposed on a fixed pitch to an upper interconnection, the method comprising: preparing design data that comprises a device pattern disposed on the fixed pitch and a lead-out interconnection pattern, which is deviated from the fixed pitch and adjacent to the fixed pitch; and merging an auxiliary pattern into the design data and subjecting the lead-out interconnection pattern to optical proximity effect correction by a CAD process to create pattern data to be implemented on a photo-mask, the auxiliary pattern being disposed on the fixed pitch and within the device pattern and configured not to be resolved by light exposure.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A pattern layout for forming an integrated circuit, the pattern layout comprising:

a first device pattern including a line and a space alternately arrayed on a fixed pitch having regular intervals in a first direction;

a second device pattern disposed on the fixed pitch and separated from the first device pattern in the first direction, the second device pattern including a line and a space each having a pattern width an odd-number times larger than the regular intervals of the fixed pitch, the odd-number being set to be three or more; and an auxiliary pattern disposed on the fixed pitch and within the second device pattern and configured not to be resolved by light exposure, the auxiliary pattern being a periodic pattern including a plurality of patterns, the plurality of patterns being formed on the line and the space of the second device pattern, the auxiliary pattern including an auxiliary space pattern and an auxiliary line pattern, the auxiliary space pattern and the auxiliary line pattern being arranged with the fixed pitch, the auxiliary pattern being arranged in parallel with the first and second device patterns.

2. The pattern layout according to claim 1, wherein the first device pattern has a pattern width the same as the regular intervals of the fixed pitch.

3. The pattern layout according to claim 1, wherein the line or space of the auxiliary pattern has a pattern width of $0.23 \times \lambda/NA$ or less, where $\lambda$ denotes an exposure light wavelength and NA denotes a numerical aperture of a light exposure apparatus.

4. The pattern layout according to claim 1, wherein the second device pattern comprises a pattern including the line and the space alternately arrayed, which have a pattern width within a range of from $P \times (2 \times N-1) \times 0.8$ to $P \times (2 \times N-1) \times 1.2$, where P denotes the fixed pitch and N denotes a natural number.

5. The pattern layout according to claim 1, wherein the first device pattern comprises a line-and-space pattern corresponding to an interconnection array of a NAND flash memory.

6. The pattern layout according to claim 1, wherein the second device pattern comprises a line-and-space pattern corresponding to an end portion of a metal interconnection array of a NAND flash memory.

7. The pattern layout according to claim 1, wherein the second device pattern comprises a pattern corresponding to a select gate of a NAND flash memory and a portion around the select gate.

8. The pattern layout according to claim 7, wherein the auxiliary space pattern is disposed within a select gate pattern.

9. The pattern layout according to claim 7, wherein the auxiliary line pattern is disposed within an inter-select-gate space pattern.

10. The pattern layout according to claim 1, further comprising a third device pattern deviated from the fixed pitch and adjacent to the fixed pitch, wherein the third device pattern comprises a pattern subjected to optical proximity effect correction by a CAD process.

11. The pattern layout according to claim 10, wherein the third device pattern comprises a pattern corresponding to a lead-out interconnection of a NAND flash memory.

12. The pattern layout according to claim 1, further comprising a dummy pattern disposed between the first and second device patterns and configured not to affect operation of the integrated circuit, wherein the dummy pattern includes a line and a space alternately arrayed on the fixed pitch.

13. The pattern layout according to claim 1, wherein space portions of the first device pattern, the second device pattern, and the auxiliary pattern are set to have the same phase relative to exposure light.

14. The pattern layout according to claim 13, wherein line portions of the first device pattern, the second device pattern, and the auxiliary pattern are set to have the same phase relative to exposure light, which is reverse to that of the space portions.

15. A photo-mask used for a light exposure process to form an integrated circuit, the photo-mask comprising:
- a first device pattern including a line and a space alternately arrayed on a fixed pitch having regular intervals in a first direction;
- a second device pattern disposed on the fixed pitch and separated from the first device pattern in the first direction, the second device pattern including a line and a space each having a pattern width an odd-number times larger than the regular intervals of the fixed pitch, the odd-number being set to be three or more; and
- an auxiliary pattern disposed on the fixed pitch and within the second device pattern and configured not to be resolved by light exposure, the auxiliary pattern being a periodic pattern including a plurality of patterns, the plurality of patterns being formed on the line and the space of the second device pattern, the auxiliary pattern including an auxiliary space pattern and an auxiliary line pattern, the auxiliary space pattern and the auxiliary line pattern being arranged with the fixed pitch, the auxiliary pattern being arranged in parallel with the first and second device patterns.

16. The photo-mask according to claim 15, further comprising a dummy pattern disposed between the first and second device patterns and configured not to affect operation of the integrated circuit, wherein the dummy pattern includes a line and a space alternately arrayed on the fixed pitch.

17. A method of manufacturing a semiconductor device, the method comprising:
- exposing a photo-resist film on a semiconductor substrate to light by use of the photo-mask according to claim 15, so as to transfer the first and second device patterns onto the photo-resist film.

18. The method according to claim 17, wherein illumination for irradiating the photo-mask with light in a diagonal direction is used to expose the photo-resist film to light.

19. A data creation method for a photo-mask, the method comprising:
- preparing design data that comprises a first device pattern including a line and a space alternately arrayed on a fixed pitch having regular intervals in a first direction, and a second device pattern disposed on the fixed pitch and separated from the first device pattern in the first direction, the second device pattern including a line and a space each having a pattern width an odd-number times larger than the regular intervals of the fixed pitch, the odd-number being set to be three or more; and
- merging an auxiliary pattern into the design data to create pattern data to be implemented on a photo-mask, the auxiliary pattern being disposed on the fixed pitch and within the second device pattern and configured not to be resolved by light exposure, the auxiliary pattern being a periodic pattern including a plurality of patterns, the plurality of patterns being formed on the line and the space of the second device pattern, the auxiliary pattern including an auxiliary space pattern and an auxiliary line pattern, the auxiliary space pattern and the auxiliary line pattern being arranged with the fixed pitch, the auxiliary pattern being arranged in parallel with the first and second device patterns.

20. The method according to claim 19, further comprising merging a dummy pattern into the design data in addition to the auxiliary pattern, the dummy pattern being disposed between the first and second device patterns and configured not to affect operation of the integrated circuit.

* * * * *